SEMICONDUCTOR DEVICE MANUFACTURE WITH JUNCTION PASSIVATION

Filed Oct. 30, 1969 2 Sheets-Sheet 1

*INVENTOR*

JEARLD L. HUTSON

*KANZ, GLASER & HARWOOD*

*ATTORNEYS*

INVENTOR
JEARLD L. HUTSON

KANZ, GLASER & HARWOOD
ATTORNEYS

United States Patent Office
3,608,186
Patented Sept. 28, 1971

3,608,186

SEMICONDUCTOR DEVICE MANUFACTURE WITH JUNCTION PASSIVATION

Jearld L. Hutson, P.O. Box 34235,
Dallas, Tex. 75234

Filed Oct. 30, 1969, Ser. No. 872,645
Int. Cl. B01j *17/00;* H01l *7/66*
U.S. Cl. 29—583 8 Claims

ABSTRACT OF THE DISCLOSURE

Junction passivated semiconductor devices and a method of manufacturing same in which a rectifying junction is formed in a semiconductor body, a plurality of spaced apart, continuous grooves are cut in a surface of the body that extend through the rectifying junction to form a plurality of devices each having a separate junction in which the plurality of separate junctions intersect the plurality of continuous grooves, respectively, along the entire length thereof, another groove is cut in the same surface of the body between adjacent ones of the plurality of grooves, the plurality of separate junctions are passivated at the surfaces of the plurality of grooves, and the plurality of devices are separated from the body along said another groove.

This invention relates to the manufacture of semiconductor devices, and more particularly to the manufacture of semiconductor devices in which one or more rectifying junctions that intersect external surfaces of the devices are passivated.

Many semiconductor devices are manufactured a plurality at a time within a single wafer of semiconductor material After the junctions of the devices have been formed by diffusion techniques or other suitable means and before electrodes are attached to the active regions thereof, the individual devices are separated out of the wafer by severing the wafer along a plurality of predetermined lines. The separating process is usually accomplished by scribing the wafer along predetermined lines with a diamond scribe or the like and then breaking the wafer along the scribe lines, or by cutting the wafer along predetermined lines with a suitable implement such as a diamond saw. All of this is well known in semiconductor device technology.

Many types of devices are manufactured in this manner with a mesa construction, in which the mesas are formed by cutting or etching grooves in the top surface of the wafer so that one or more active junctions of the individual devices intersect the surfaces of the grooves. In this case, it is better practice to passivate these junctions at the grooves that they intersect so that the junctions are protected from contamination that would degrade the operating characteristics of the devices. Several types of passivation are now known, such as glass that is fused to the surface of the grooves over the exposed junctions, or creating a layer of silicon dioxide at the surfaces during a diffusion process when fabricating silicon devices, for example. All of this is also well known and is widely practiced in the industry.

To separate the individual devices out of the wafer, the wafer is severed along the grooves that were cut to form the mesas. It has been found, however, that severing the wafer along the grooves often causes physical damage to the glass or silicon dioxide surface that provides passivation, this usually taking the form of fine cracks that extend through the glass or silicon dioxide to the active junction itself. This, of course, provides a path or opening through which impurities can pass to contaminate the junction. Therefore, the manufacturing yield is lessened percentagewise.

Accordingly, this invention has an object to provide a method of manufacturing semiconductor devices from a wafer of semiconductor material in which the devices have one or more junctions that are passivated for protection, but in which the passivation which is applied prior to separating the wafer into the individual devices is not damaged during the subsequent separating process. This is accomplished by cutting a plurality of spaced apart, continuous grooves in a surface of the wafer to form the mesas and referred to above, then cutting an additional groove between the adjacent continuous grooves. The wafer is separated along the additional groove rather than the grooves that form the mesas, so that any damage to the surface along a severance line is shielded from the active junction itself. It is desirable to separate the wafer into individual devices along the grooves, since this is obviously a line of minimum physical strength of the wafer due to the reduced thickness thereof. Not so obvious is the utilization of tension within glass used as passivation to act as a breaking force, thus aiding the separation process. This feature will be described in detail hereinafter.

The additional groove functions in another very important manner. Devices having mesa constructions are usually employed rather than with a planar construction to attain higher voltages across a rectifying junction when the latter is in a blocking mode. When these devices are mounted or soldered to a header or other common metal base, the higher voltages tend to cause arcing over between the header and one or more active regions of the devices at the periphery thereof that is not insulated. This problem becomes more acute as the distance of separation between the exposed region of the device and the header is decreased. According to one aspect of the invention, the additional groove is located at the periphery of the device, and by providing an electrical insulation in this groove such as glass passivation increases the effective distance from the header to any exposed region of the device between which arcing could occur.

All of the above advantages of the invention, in addition to other objects, features and advantages, will become readily apparent from the following description thereof when taken in conjunction with the appended claims and the drawings, wherein like reference numerals refer to like parts throughout the several figures, and in which:

The invention will be described with reference to devices and particular electrical conductivity types, although it will be understood that the various conductivity types can be interchanged and other devices can be manufactured without departing from the invention.

Figure 1:
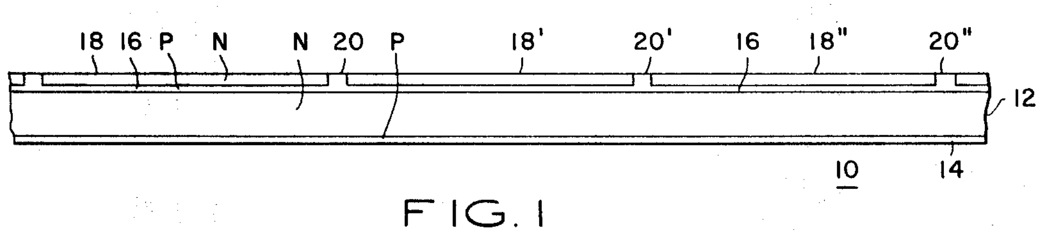
FIG. 1 is a fragmentary, side elevational view, in section, of a wafer of semiconductor material into which various impurities have been diffused to form rectifying junctions therein.

Referring specifically to FIG. 1, there is shown a fragmentary, side elevational view, in section, of a semiconductor wafer 10 into which various impurities have been diffused to form a plurality of regions and rectifying junctions therein. The semiconductor wafer 10 is characterized by n-type electrical conductivity, for example, and is diffused at both faces thereof with impurities that determine p-type conductivity. When this is done, a p-type region 14 is formed in the bottom face of the wafer, and similarly, a p-type region 16 is formed in the top face of the wafer, thus leaving an n-type region 12 separating the two and forming rectifying junctions with both. The particular devices that are being fabricated as described in this example are semiconductor controlled rectifiers, each of which will have four successively adjacent regions of alternate electrical conductivity types. After the p-type conductivity diffusion, the wafer is masked at the top surface by any suitable means and a plurality of n-type conductivity emitters 18, 18′, 18″, etc. are diffused into the top surface thereof. The masking blocks the diffusion at spaced intervals so as to permit access to the p-type region 16. That is to say, the n-type diffusion forming the various emitters 18, 18′, etc. results in a planar construction so that the junctions between the various emitters and p-type region 16 are brought to the top surface. This leaves surface exposed portions 20, 20′, 20″, etc. of the p-type region 16. As will be seen hereinafter, n-type regions 18, 18′, 18″, etc. constitute the emitters of the various SCR's, region 16, 16′, 16″, etc. constitute the p-type bases of the SCR's having surfaced exposed portions 20, 20′, 20″, etc., respectively, the original n-type conductivity material 12 constitutes the n-type base regions therefor and the p-type region 14 constitutes the p-type emitters therefor.

Figure 2:
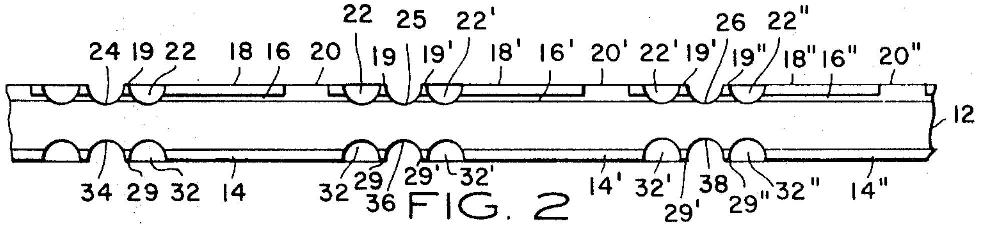
FIG. 2 is a fragmentary, side elevational view, in section, of the wafer shown in FIG. 1 in which grooves have been cut in the top and bottom surfaces of the wafer.
Figure 3:
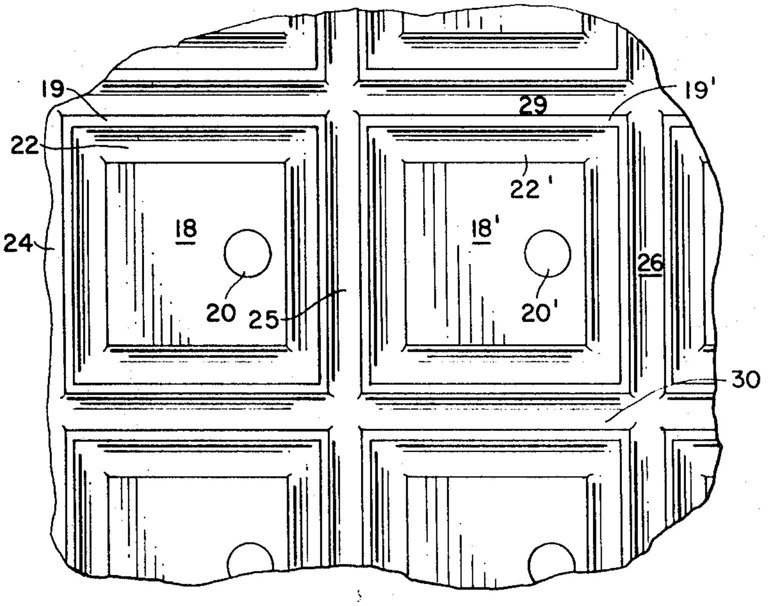
FIG. 3 is a fragmentary, top plan view of the semiconductor wafer shown in FIG. 2.

FIG. 2 is a fragmentary, side elevational view, in section, of the wafer shown in FIG. 1 in which grooves have been cut in the top and bottom surfaces of the wafer, and FIG. 3 is a fragmentary, top plan view of the wafer shown in FIG. 2. As shown in these figures, continuous grooves, or moats 22, 22′, etc. are etched in the top surface of the wafer, wherein these moats extend through the junction between the n-type emitters 18, 18′, etc. and the p-type base regions 16, 16′, etc., and also through the junction between the p-type bases 16, 16′, etc. and the n-type base region 12. These moats are continuous in that they constitute an enclosure in one plane that defines the perimeters of various junctions that intersect the moats along the entire lengths thereof. These moats are etched by employing suitable masking techniques, all as well known in this art. At the same time, a plurality of parallel and spaced apart grooves 24, 25, 26, etc. are etched in the top surface of the wafer and also extend through the two previously mentioned junctions, and are disposed between adjacent moats and spaced therefrom by lands. Thus, for example, groove 25 is disposed between adjacent moats 22 and 22′ and is spaced therefrom by lands 19 and 19′, respectively. Also simultaneously therewith, another plurality of parallel and spaced apart grooves 29, 30, etc. (shown in FIG. 3) are etched perpendicular to the last mentioned grooves and which are also disposed intermediate adjacent moats and spaced therefrom. All of these grooves and moats are etched simultaneously to form a gridwork in the top surface of the wafer that is more clearly shown in FIG. 3.

The bottom surface of the wafer is etched simultaneously with etching of the top surface to provide a gridwork therein. Corresponding moats 32, 32′, etc. are etched that penetrate the junction between the n-type base 12 and p-type emitter 14. Lands 29, 29′, etc. that are created by cutting the grooves correspond to lands 19, 19′, etc., respectively. At the same time, parallel and spaced apart grooves 34, 36, 38, etc. are cut that correspond to grooves 24, 26, 28, etc., respectively. Similarly, other grooves (not shown) perpendicular to the last mentioned grooves are cut that correspond, respectively, with grooves 29, 30, etc.

It will now be seen that a plurality of distinct regions have been created in the wafer by physical isolation from each other provided by the grooves. In this instance, n-type emitters 18, 18′, etc. have been created with corresponding p-type bases 16, 16′, etc. Similarly, individual p-type emitters 14, 14′, etc. have been created. It will also be seen that the blocking junctions between the n-type base and the various p-type bases intersects the various moats, respectively, along the entire lengths thereof. These regions constitute the various regions for SCR's in this example, subject to separating the wafer into a plurality of devices. Thus, a semiconductor controlled rectifier is formed having a p-type emitter 14, an n-type base region 12, a p-type base region 16 and an n-type emitter 18, wherein the p-type base region 16 has a surface exposed portion 20. Moat 22 completely surrounds the active n-type emitter 18 and p-type base 16 including the surface exposed portion 20 thereof. In addition, another groove surrounds the moat on the outside of land 19 that is comprised of sections of grooves 24, 29, 25 and 30, as shown in FIG. 3. Similarly, an adjacent device is comprised of p-type emitter 14′, n-type base region 12, p-type base region 16′ having surface exposed portion 20′ and n-type emitter 18′. The n-type emitter and p-type base are surrounded by moat 22′, which in turn is surrounded by another groove that is comprised of sections of grooves 25, 29, 26 and 30. It will be seen from FIG. 3 that the two devices just described share that portion of groove 25 that extends therebetween. In fact, all of grooves 24, 25, 26, etc. in conjunction with all of grooves 29, 30, etc. can be considered to constitute a single groove. Similar considerations hold for the bottom surface of the wafer.

Figure 4:
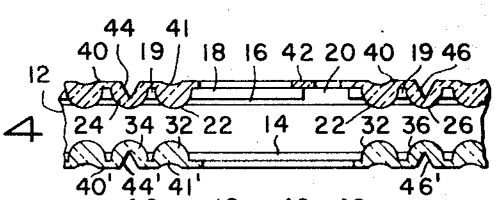
FIG. 4 is a fragmentary, side elevational view, in section, of the semiconductor wafer shown in FIG. 2 in which glass, for passivation purposes, has been fused to the surfaces of the grooves.

After the grooves and moats have been etched, the device is passivated to protect the junctions that intersect exposed surfaces of the device. Glass passivation, for example, can be employed, although other suitable means for passivation can also be used. Referring to FIG. 4, which is a fragmentary, side elevational view, in section, of the wafer shown in FIGS. 2 and 3, glass is initially applied to the entire top and bottom surfaces of the wafer including the grooves therein. The glass is then fused to these surfaces, and thereafter suitable masking is employed to selectively etch away the glass in the areas to which electrical contacts or electrodes will be attached. Because of the necessity to obtain as much current carrying capacity as possible for the device, as much as possible of the areas of the n-type emitters 18, 18′, etc. and p-type emitters 14, 14′, etc. are left exposed by etching the glass away. Of course, some of the glass is etched from the surface exposed portions 20, 20′, etc. of the p-type bases 16, 16′, etc. respectively, so that electrodes can be attached to these regions. The resulting structure is shown in FIG. 4 in which a layer 40 of glass is fused to the top surface of the wafer with the major portion of the surface of n-type emitter 18 being left exposed by etching away the glass in this area, and with a portion of the top surface of the surface exposed portion 20 of p-type base region 16 being left exposed. The topography of the glass surface will generally correspond to the topography of the surface of the wafer, so that small recesses 41 result in the top surface of the glass immediately overlying the moats and grooves. Similarly, a layer of glass 40′ is fused to the bottom surface of the wafer with reliefs 41′ corresponding to the topography of the bottom surface.

The wafer is now ready to be separated into individual devices. To accomplish this, a diamond scribe or other suitable means is employed to scribe the top surface of the wafer along break lines, wherein cuts 44, 46, etc. are scribed along the lengths of grooves 24, 26, etc., respectively, and cuts (not shown) are scribed along the lengths of grooves 30, 32, etc. Similarly, cuts 44', 46', etc. are scribed in grooves 34, 36, etc., respectively, and other cuts are scribed in the perpendicular grooves in the bottom (not shown). The cuts in the two surfaces correspond so that the wafer can then be broken along these cuts into various individual devices as shown in the side elevational view, in section, of FIG. 5 and the perspective view of FIG. 6.

Figure 5:
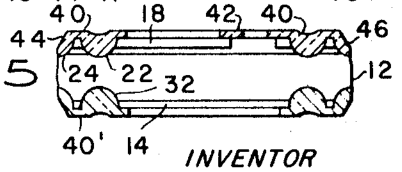
FIG. 5 is a side elevational view, in section, of a single device that has been separated from the wafer shown in FIG. 4.
Figure 6:
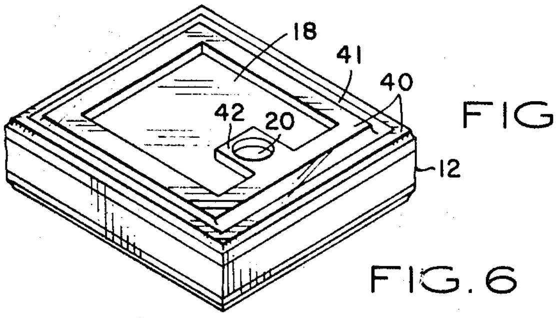
FIG. 6 is a perspective view of the device shown in FIG. 5.

The resulting device shown in FIGS. 5 and 6 constitutes, for example, a semiconductor controlled rectifier in which the blocking junction between p-type base region 16 and the n-type base region 12 is completely surrounded by moat 22, with this junction intersecting this moat along the entire length thereof. Moreover, the n-type emitter 18 is completely surrounded by this moat, and the p-type emitter 14 is surrounded by moat 32 with the junction between the p-type emitter and the n-type base intersecting this moat along the entire length thereof. These junctions are passivated at the surfaces of these moats, in addition to glass passivation being provided for junctions intersecting the top surface of the device. Rather than separating the wafer into individual devices along lines corresponding to the moats as is usually done, the wafer is separated along the additional grooves disposed between adjacent moats surrounding the active regions of the devices. Thus it is immaterial whether damage is created in the glass surface contained within the grooves, since the junctions immediately underlying lands 19, 19', etc. are no longer active in the operation of the devices. That is to say, these two junctions are electrically isolated from the junctions between the n-type emitters 18, 18', etc. and p-type bases 16, 16', etc., and the junctions between p-type bases 16, 16', etc. and n-type bases 14, respectively.

It has been found very useful to fuse glass of sufficient thickness to the surfaces of the various grooves along which the wafer is separated into the individual devices. This takes advantage of an additional breaking or separating force caused by tension in the fused glass. Since glass and silicon, for example, have considerably different temperature coefficients of expansion, the glass is put under considerable tension as the wafer is cooled after melting the glass to fuse it to the wafer at an elevated temperature. When the wafer is separated into the individual devices after the cuts have been scribed in these glass surfaces, the glass has a natural tendency to part along the cut because of the tension therein. It is also desirable to separate the wafer along lines corresponding to these grooves, since these grooves coincide with lines of minimum strength of the wafer as a result of the reduced thickness of the wafer. In any event, it will be seen that no damage to the glass or other passivation surface adjacent the active rectifying junctions of the devices can occur in the separation process.

Figure 7:
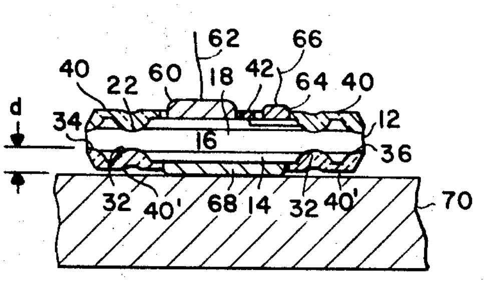
FIG. 7 is a side elevational view, in section, of a device similar to that shown in FIGS. 5 and 6 that has electrodes attached to active regions thereof and which is mounted on a header.
Figure 7A:
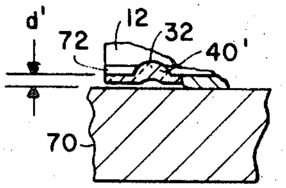
FIG. 7A is a fragmentary, side elevational view, in section, of a device similar to that shown in FIG. 7 but without the additional groove cut at the bottom periphery thereof.

A side elevational view, in section, of the device shown in FIGS. 5 and 6 when mounted on a header is shown in FIG. 7. Electrodes are also shown attached to the device, with an electrode 60 ohmically connected to the n-type emitter 18 with a corresponding lead wire 62 attached thereto, and an electrode 64 attached to the p-type base 16 with an electrical lead wire 66 attached thereto. In many instances, a device of this type will be soldered to a metal header so as to provide an ohmic connection between the common metal header 70 and the p-type emitter 14 by means of solder 68. Since mesa type devices of this nature are normally operated with relatively high voltages across the junctions, a problem of arcing between the side or edge of the device and the metal header often occurs. That is to say, arcing could occur between the edge of n-type base 12 and the metal header 70 if the voltage applied across the device exceeds a predetermined maximum, or if n-type base 12 at the edge of the device is physically too close to the header 70, or both. To illustrate this, reference is had to the fragmentary, side elevational view, in section, of FIG. 7A in which the additional groove is not provided at the periphery of the bottom surface of the wafer, and only a moat 32 is provided. It will be seen that a portion 72 of p-type emitter 14 is physically very close to the header 70 at the edge of the device, schematically illustrated at a distance *d'*. Since the wafer has been separated at the edge with no protection provided for the junction between the portion 72 and the n-type base 12, the junction at the edge is electrically obliterated, and for all practical purposes electrically common to the n-type base 12 at the edge. Therefore, the n-type base region 12 is effectively very close to the metal header 70 in the structure shown in FIG. 7A. With only the small separation *d'* between the two, arcing is a distinct problem at high voltages. With the additional groove 34 etched at the periphery of the device as shown in FIG. 7 and along which the wafer is separated, a much greater distance of separation is provided between n-type base 12 and the header 70, since the junction between the n-type base 12 and the isolated portion of p-type emitter 14 is not left exposed at the edge. Consequently, the device of FIG. 7 is not nearly so subject to the arcing problem as mentioned above.

Figure 8:
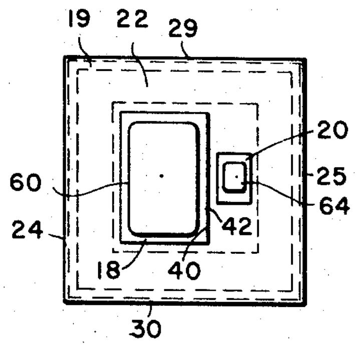
FIG. 8 is a top plan view of the device shown in FIG. 7.

A top plan view of the device of FIG. 7 is shown in FIG. 8 wherein it is seen that the glass layer 40 covers almost the entire top surface of the device with the exception of a window overlying most of the area of n-type emitter 18 and a smaller window overlying some of the area of surface exposed portion 20 of p-type base region 16. The narrow channel of glass 42 is provided to cover and protect that portion of the junction between n-type emitter 18 and p-type base 16 that intersects the top surface of the device. Electrodes 60 and 64 are attached to the emitter and base, respectively. For purposes of clarity so as to illustrate the surface exposed portions of the n-type emitter and p-type base, these electrodes have been shown to cover not quite all of the window areas, although it will be realized that in usual practice, the electrodes completely fill the areas of the windows. Channel 22 completely surrounds the n-type emitter and p-type base as indicated between lines shown in phantom, with land 19 and the additional groove comprised of portions of grooves 24, 29, 25 and 30 being shown accordingly.

It is always desirable to provide the additional groove in at least one of the top or bottom surfaces that surrounds the continuous groove or moat that is cut to form the mesa. First, it provides a weak line through the wafer along which the individual devices may be easily separated therefrom. Secondly, additional breaking power is obtained when glass is used as a passivating medium and glass is deposited and fused into this additional groove. Third, it reduces or eliminates arcing between active regions of the device and metal headers on which the devices are mounted when this additional groove is cut in the bottom surface. However, it is preferable to cut the additional grooves in both surfaces as shown in FIG. 7 when mesas are cut in both surfaces, all for the reasons set forth above.

Figure 9:
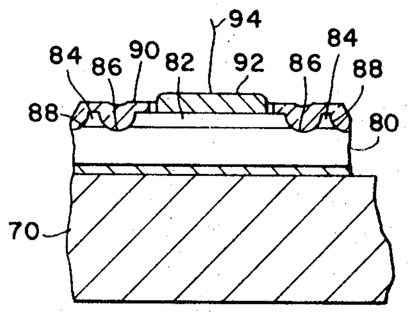
FIG. 9 is a side elevational view, in section, of still another device illustrating a further embodiment of the invention.

Another embodiment where only a single additional groove is employed at the top surface of the wafer is shown in FIG. 9, which is a side elevational view, in section, of a semiconductor diode. A body of semiconductor material 80 of a first conductivity type has impurities diffused in one surface thereof to form another region 82 of a second conductivity type. Thereafter, continuous groove 86 is cut in the top surface of the body that extends through the junction formed between regions 80 and 82. At the same time, an additional groove 88 is cut in the top surface of the body outside of groove 86 to leave an annular land 84 surrounding groove 86. It will be realized, of course, that several devices are being fabricated simultaneously within a single wafer of material. After the grooves have been cut, passivation, such as glass, is employed to protect the junction intersecting groove 86 and the wafer is then separated along lines corresponding to groove 88. An electrode 92 is attached to the region 82 with corresponding electrical lead wire 94 connected to the electrode. The device can be mounted on a metal header 70, or any other suitable electrode can be attached to region 80. Since there are no junctions in the bottom surface of the wafer, no grooves are necessary and no glass passivation is used at the bottom.

Although the invention has been described with reference to particular embodiments thereof, many modifications and substitutions that do not depart from the true scope of the invention will be readily apparent to those skilled in the art. It is therefore intended that the invention be limited only as defined in the appended claims.

What is claimed is:

1. A method of making semiconductor devices with surface exposed junctions from a body of semiconductor material, and passivating said surface exposed junctions, comprising the steps of:

(a) forming a region in said body to create a rectifying junction therein, (b) cutting a plurality of spaced apart, continuous grooves in a surface of said body that extend through said rectifying junction to form a plurality of mesa type structures with individual rectifying junctions in which said individual rectifying junctions intersect, respectively, said plurality of grooves along the entire lengths thereof, (c) cutting additional grooves in the same surface of said body between adjacent pairs, respectively, of said plurality of continuous grooves, (d) passivating said individual rectifying junctions at the surfaces of said plurality of continuous grooves, and (e) separating said body into a plurality of separate devices along said additional grooves.

2. A method as set forth in claim 1 in which said individual rectifying junctions are passivated by fusing glass to the surfaces of said plurality of continuous grooves.

3. A method as set forth in claim 1 including forming another region in said body to create another rectifying junction therein, cutting another plurality of spaced apart, continuous grooves in an opposite surface of said body that extend through said another rectifying junction to form another plurality of mesa type structures with individual rectifying junctions in which said individual rectifying junctions intersect, respectively, said another plurality of grooves along the entire lengths thereof, cutting other grooves in said opposite surface between adjacent pairs, respectively, of said another plurality of continuous grooves that extend through said another rectifying junction and that substantially coincide with said additional grooves in said first mentioned surface, and passivating said individual rectifying junctions at the surfaces of said another plurality of continuous grooves.

4. A method as set forth in claim 1 in which said additional grooves comprise a gridwork of intersecting grooves.

5. A method as set forth in claim 1 in which said individual rectifying junctions are passivated by forming a layer of material on the surfaces of said plurality of continuous grooves, including forming a layer of said material on the surfaces of said additional grooves and still further grooves are cut in said layer of material formed on said surfaces of said additional grooves prior to separating said body into a plurality of separate devices.

6. A method as set forth in claim 5 wherein forming said layers of material on said surfaces of said plurality of continuous grooves and said additional grooves comprises fusing glass thereto at an elevated temperature that is put in tension when said body and said glass are cooled from said elevated temperature.

7. A method as set forth in claim 3 including applying an electrically conductive material to said opposite surface of said body that forms an ohmic connection therewith and mounting said plurality of separate devices on a plurality of electrically conductive bases, respectively, by joining said electrically conductive material thereto.

8. A method as set forth in claim 1 in which said individual rectifying junctions are passivated by fusing a layer of glass on the surfaces of said plurality of continuous grooves, including fusing glass on the surfaces of said additional grooves, and scribing lines in said glass contained in said additional grooves, wherein said body is separated along said scribe lines.

References Cited

UNITED STATES PATENTS

| | | | |
|---|---|---|---|
| 3,163,916 | 1/1965 | Gault | 29—583 |
| 3,332,143 | 7/1967 | Gentry | 29—583 |
| 3,535,774 | 10/1970 | Baker | 29—580 |

JOHN F. CAMPBELL, Primary Examiner

W. TUPMAN, Assistant Examiner